United States Patent
Telefus et al.

(10) Patent No.: US 11,245,339 B2
(45) Date of Patent: *Feb. 8, 2022

(54) ELECTRONIC SWITCH AND DIMMER

(71) Applicant: INTELESOL, LLC, Danville, CA (US)

(72) Inventors: Mark Telefus, Orinda, CA (US); Harry Rodriguez, Gilroy, CA (US)

(*) Notice: Subject to any disclaimer, the term of this patent is extended or adjusted under 35 U.S.C. 154(b) by 356 days.

This patent is subject to a terminal disclaimer.

(21) Appl. No.: 16/340,774

(22) PCT Filed: Oct. 27, 2017

(86) PCT No.: PCT/US2017/058842
§ 371 (c)(1),
(2) Date: Apr. 10, 2019

(87) PCT Pub. No.: WO2018/081619
PCT Pub. Date: May 3, 2018

(65) Prior Publication Data
US 2020/0052607 A1    Feb. 13, 2020

Related U.S. Application Data

(60) Provisional application No. 62/431,926, filed on Dec. 9, 2016, provisional application No. 62/414,467, filed on Oct. 28, 2016.

(51) Int. Cl.
*H02M 7/217* (2006.01)
*H02J 13/00* (2006.01)
(Continued)

(52) U.S. Cl.
CPC ........ *H02M 7/217* (2013.01); *G01R 19/2513* (2013.01); *G05F 1/66* (2013.01);
(Continued)

(58) Field of Classification Search
CPC .......... H02M 1/36; H02M 1/32; H02M 7/217; H02M 5/2932; H05B 47/10; H02P 27/04
See application file for complete search history.

(56) References Cited

U.S. PATENT DOCUMENTS 4,074,345 A    2/1978   Ackermann
4,127,895 A   11/1978   Krueger
(Continued)

OTHER PUBLICATIONS

Carvou, E. et al, Electrical Arc Characterization for Ac-Arc Fault Applications, 2009 Proceedings of the 55th IEEE Holm Conference on Electrical Contacts, IEEE Explore Oct. 9, 2009.
(Continued)

*Primary Examiner* — Rina I Duda
(74) *Attorney, Agent, or Firm* — Mark Wisnosky

(57) ABSTRACT

A bidirectional switch for the control of power from an AC source to a load is described. The approach uses power MOSFETs in a bidirectional switch subcircuit configuration having an optically coupled, electrically floating control circuit that self-biases the switches into the "on" state and uses an optically coupled control element to force the switches into the "off" state. The time constant of the control circuit is fast enough to allow phase control as well as on-off control. A boost circuit is included to ensure that the control voltage exceeds a threshold voltage of the MOSFETs to force an off state. A plurality of subcircuits can be easily cascaded to provide improved performance.

16 Claims, 16 Drawing Sheets

(51) Int. Cl.
  *H05B 47/10* (2020.01)
  *H02P 27/04* (2016.01)
  *G01R 19/25* (2006.01)
  *G05F 1/66* (2006.01)
  *H02J 3/00* (2006.01)

(52) U.S. Cl.
  CPC .......... *H02J 3/00* (2013.01); *H02J 13/00007* (2020.01); *H02P 27/04* (2013.01); *H05B 47/10* (2020.01)

(56) References Cited

U.S. PATENT DOCUMENTS

| | | | |
|---|---|---|---|
| 4,466,071 A | 8/1984 | Russell, Jr. | |
| 4,487,458 A * | 12/1984 | Janutka | H03K 17/102 327/432 |
| 4,581,540 A | 4/1986 | Guajardo | |
| 4,631,625 A | 12/1986 | Alexander et al. | |
| 4,760,293 A | 7/1988 | Hebenstreit | |
| 4,812,995 A | 3/1989 | Girgis et al. | |
| 5,121,282 A | 6/1992 | White | |
| 5,371,646 A | 12/1994 | Biegelmeier | |
| 5,654,880 A | 8/1997 | Brkovic et al. | |
| 5,796,274 A | 8/1998 | Willis et al. | |
| 5,933,305 A | 8/1999 | Schmaltz et al. | |
| 6,081,123 A | 6/2000 | Kasbarian et al. | |
| 6,111,494 A | 8/2000 | Fischer | |
| 6,141,197 A | 10/2000 | Xu | |
| 6,169,391 B1 | 1/2001 | Lei | |
| 6,188,203 B1 | 2/2001 | Rice et al. | |
| 6,538,906 B1 | 3/2003 | Ke et al. | |
| 6,813,720 B2 | 11/2004 | Leblanc | |
| 6,839,208 B2 | 1/2005 | MacBeth et al. | |
| 6,984,988 B2 | 1/2006 | Yamamoto | |
| 7,053,626 B2 | 5/2006 | Monter et al. | |
| 7,110,225 B1 | 9/2006 | Hick | |
| 7,164,238 B2 | 1/2007 | Kazanov et al. | |
| 7,319,574 B2 | 1/2008 | Engel | |
| 7,586,285 B2 | 9/2009 | Gunji | |
| 7,693,670 B2 | 4/2010 | Durling et al. | |
| 7,729,147 B1 | 6/2010 | Wong et al. | |
| 7,746,677 B2 | 6/2010 | Unkrich | |
| 7,948,719 B2 | 5/2011 | Xu | |
| 8,374,729 B2 | 2/2013 | Chapel et al. | |
| 8,463,453 B2 | 6/2013 | Parsons, Jr. | |
| 8,560,134 B1 | 10/2013 | Lee | |
| 8,717,720 B2 | 5/2014 | Deboer | |
| 8,817,441 B2 | 8/2014 | Callanan | |
| 8,947,838 B2 | 2/2015 | Yamai et al. | |
| 9,287,792 B2 | 3/2016 | Telefus et al. | |
| 9,577,420 B2 | 2/2017 | Ostrovsky et al. | |
| 9,621,053 B1 | 4/2017 | Telefus | |
| 10,469,077 B2 * | 11/2019 | Telefus | H05B 45/3725 |
| 10,812,072 B2 * | 10/2020 | Telefus | H05B 45/3725 |
| 2004/0032756 A1 | 2/2004 | Van Den Bossche | |
| 2005/0162139 A1 * | 7/2005 | Hirst | H03K 17/6874 323/239 |
| 2007/0008747 A1 * | 1/2007 | Soldano | H02M 7/217 363/21.04 |
| 2008/0180866 A1 | 7/2008 | Wong | |
| 2008/0204950 A1 | 8/2008 | Zhou et al. | |
| 2009/0168273 A1 | 7/2009 | Yu et al. | |
| 2009/0213629 A1 | 8/2009 | Liu et al. | |
| 2010/0091418 A1 | 4/2010 | Xu | |
| 2010/0155369 A1 | 6/2010 | Kularatna et al. | |
| 2010/0320840 A1 | 12/2010 | Fridberg | |
| 2011/0121752 A1 * | 5/2011 | Newman, Jr. | H05B 39/048 315/291 |
| 2011/0156610 A1 | 6/2011 | Ostrovsky et al. | |
| 2011/0292703 A1 | 12/2011 | Cuk | |
| 2012/0026632 A1 | 2/2012 | Acharya et al. | |
| 2012/0089266 A1 | 4/2012 | Tomimbang et al. | |
| 2014/0085940 A1 | 3/2014 | Lee et al. | |
| 2015/0097430 A1 * | 4/2015 | Scruggs | H02J 9/06 307/23 |

OTHER PUBLICATIONS

Yang et al, Series Arc Fault Detection Algorithm Based on Autoregressive Bispectrum Analysis, Algorithms 2015, 8, 929-950; doi:10.3390/a8040929.

Restrepo, Arc Fault Detection and Discrimination Methods, Electrical Contacts—2007 Proceedings of the 53rd IEEE Holm Conference on Electrical Contacts, IEEE Explore Sep. 24, 2007.

Eguchi et al, Design of a Charge-Pump Type AC-DC Converter for RF-ID Tags, 2006 International Symposium on Communications and Information Technologies, F4D-3, IEEE (2006).

Park, Jeong-Eon, et al, Design on Topologies for High Efficiency Two-Stage AC-DC Converter, 2012 IEEE 7th International Power Electronics and Motion Control Conference—ECCE Asia Jun. 2-5, 2012, Harbin, China, p. 257.

Cuk, Slobodan, 98% Efficient Single-Stage AC/DC Converter Topologies, Power Electronics Europe, Issue 4, 2011, www.power-mag.com; p. 16.

Ayari, A et al, Active Power Measurement Comparison Between Analog and Digital Methods, International Conference on Eleclrical Engineering and Software Applications 2013.

Gregory, George D. The Arc-Fault Circuit Interrupter, An Emerging Product, IEEE 1998.

* cited by examiner

ELECTRONIC SWITCH AND DIMMER

CROSS-REFERENCE TO RELATED APPLICATIONS

This application claims priority to U.S. Provisional Patent Application 62/431,926, Titled: Electronic Switch and Dimmer, Filed Dec. 9, 2016, and, U.S. Provisional application 62/414,467, Titled: High Efficiency AC to DC Converter and Methods, Filed Oct. 28, 2016 both including common inventors.

STATEMENT REGARDING FEDERALLY SPONSORED RESEARCH OR DEVELOPMENT

Not Applicable.

BACKGROUND OF THE INVENTION

Technical Field

The invention relates to a power management system and methods to provide an electronic switch and dimming control.

Related Background Art

Traditional access to alternating current (AC) electrical power in home and business environments is provided by mechanical outlets that are wired into the facility electrical system. These outlets are protected from excessive electrical loads or potentially dangerous ground faults using electromechanical devices such as fuses and circuit breakers. Similarly, the control of conventional electrical room appliances such as lighting and ceiling fans occurs using electromechanical switches. These fundamentally mechanical control devices provide simple on-off control and inevitably wear out and, over time, can cause short circuits or potentially dangerous arcing.

More nuanced control of common electrical appliances is typically provided by electronic devices such as triacs which allow the AC mains waveform to be interrupted on a cycle-by-cycle basis, so-called phase control. Although significantly more efficient than the rheostats or autotransformers that preceded them, triacs are still too inefficient to be used effectively in small enclosures for the control of large electrical loads and can induce electrical noise back into the facility electrical system.

Thus, there is a need for an improved electronic control system that provides a wider range of more reliable and highly efficient control options for broad application in facility electrical systems. Furthermore, there is a need for such a control system that can be realized using semiconductor devices that can be integrated with other circuitry for advanced power control functions that can be manufactured at low cost.

BRIEF SUMMARY OF THE INVENTION

The present invention relates to a novel approach for the control of AC power throughout a facility electrical system ranging from simple outlet on-off switching to continuous variation of the applied AC power for, for example, the dimming of electrical lights. More particularly the invention relates to a combination of functions that provides in one embodiment both on-off and phase-control of the AC mains waveform. One embodiment uses power MOS field-effect transistors (MOSFETs) as electronic switches having very low "on" resistance connected between the AC mains supply and the desired load. Since typical power MOSFETs intrinsically incorporate a body diode in parallel with the conducting channel, pairs of devices are connected in a back-to-back arrangement having the source terminals in common to provide a truly bidirectional (AC) switch configuration. In order to control the switching action of the power MOSFETs a novel floating control circuit is employed that uses rectifying diodes connected at the drains to precharge the gate-source bias voltage thereby turning both devices "on", and an optically coupled phototransistor that shorts the gate terminals to the common source terminal to force the devices into their "off" state when illuminated by an isolated optical source. Thus, the power MOSFET switches are normally "on" unless forced "off" by the optical control signal. The optical control signal can be applied continuously for nominal on-off control of the power delivered to the load, or it can be synchronized with the AC mains waveform to provide phase control. Integrated control circuitry for the optical control signal can provide either leading edge phase control preferred for switching reactive loads or trailing edge phase control preferred for nonlinear loads such as LEDs. The specific examples are not intended to limit the inventive concept to the example application. Other aspects and advantages of the invention will be apparent from the accompanying drawings and detailed description.

DETAILED DESCRIPTION OF THE INVENTION

Figure 1:
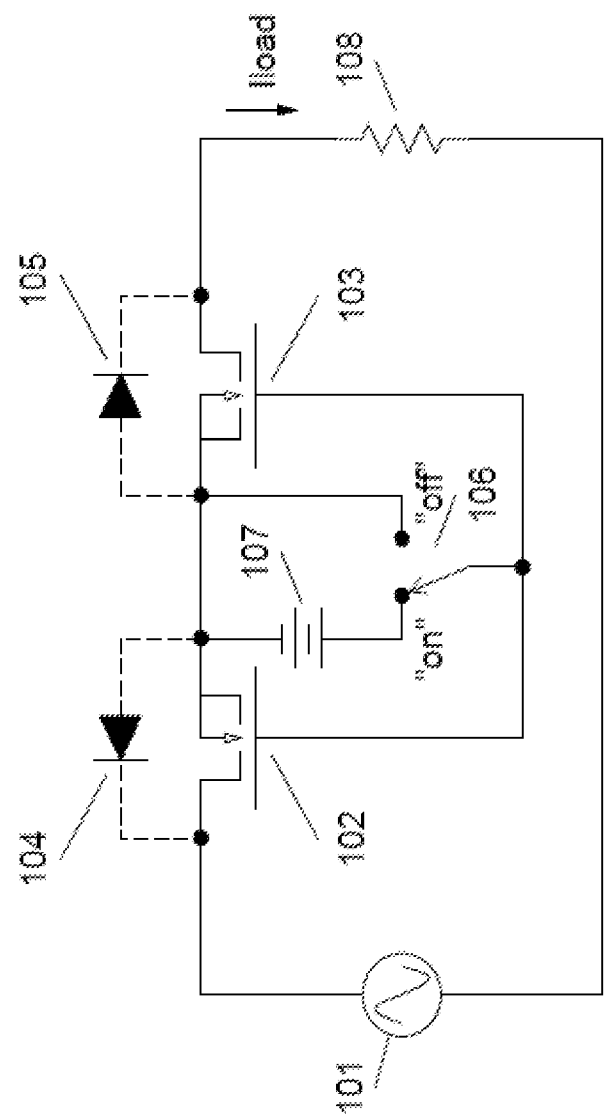
FIG. 1 is a schematic diagram of the basic power MOSFET bidirectional switch unit.

FIG. 1 is a schematic diagram showing the basic power MOSFET bidirectional switch controlling the power delivered from AC source 101 to load 108. Power MOSFETs 102 and 103 include body diodes 104 and 105, respectively. Switch 106 controls the gate-to-source bias voltage applied to power MOSFETs 102 and 103. In the "on" position bias voltage 107 is applied to the gate terminals of the power MOSFETs. Voltage 107 is a voltage greater than the threshold voltage of the power MOSFETs (typically 5 to 10 volts) causing an inversion layer to form thereby creating a conducting channel extending from the drain to the source of each device. In this "on" state, the drain-to-source behavior of each power MOSFET can be modeled as a low value resistor, $R_{ds}$. As long as the voltage drop between drain and source remains below about 0.6 volt, the body diodes remain nonconductive and can be neglected. In the "on" state the circuit of FIG. 1 is equivalently the load 108 connected to AC source 101 through a series resistor having value $2R_{ds}$.

In the "off" position of switch 106 the gate terminals of the power MOSFETs are shorted to the source terminals and the drain-to-source conducting channels vanish as long as the drain-to-source voltage remains below the breakdown voltage of the body diodes. In the "off" state the circuit of FIG. 1 is equivalently the load 108 connected to AC source 101 through back-to-back body diodes 104 and 105, which effectively disconnects the load 108 from source 101.

The requirement that the drain-to-source voltage of the power MOSFETs remain below the breakdown voltage of the body diodes, $V_{br}$, in the "off" state requires that the breakdown voltage of the body diodes exceed the peak voltage of AC source 101. Thus, for example, assuming that source 101 corresponds to a common 120 volt (rms) AC mains, then the breakdown voltage of each body diode must exceed the peak source voltage of 170 volts.

A more detailed analysis of the power MOSFET structure shows that the body diode is effectively the base-collector junction of a bipolar transistor connected in parallel with the MOSFET channel. Additional parasitic elements include the capacitance of the base-collector junction and a parasitic resistance between the base and the emitter. This AC-coupled circuit places a constraint on the rate of change of the drain-to-source voltage, $dV_{ds}/dt$, to avoid forward biasing the base-emitter junction, thereby causing the bipolar transistor to conduct while the MOSFET channel is "off". While the resulting leakage current may not be sufficient to energize the load 108, it may be large enough to cause additional efficiency or safety concerns.

Similarly, consideration of the constraints in the "on" state require that the drain-to-source voltage drop for each power MOSFET given by $R_{ds}*Iload$ be less than about 0.6 volts. Potentially more important is the power dissipated in each power MOSFET in the "on" state given by $R_{ds}*Iload^2$ which must remain less than a few watts to avoid excessive temperature rise. Thus, for example, switching a common household circuit from a 120 volt AC mains having a typical limit of 20 amperes requires that $R_{ds}$ for each power MOSFET be less than 0.005 ohms (5 milliohms.)

It is well known in the art that the breakdown voltage of the body diode can be advantageously traded off against the value of $R_{ds}$ by varying the structure and the doping levels in the device. In particular, it has been shown that the value of $R_{ds}$ is proportional to $V_{br}^{2.5}$. Thus, for example, cutting $V_{br}$ in half results in reducing $R_{ds}$ by a factor of 5.7. The circuit of FIG. 1 shows that the conceptual bias switching circuit comprising switch 106 and voltage source 107 floats electrically with the common source terminals of the back-to-back power MOSFETs 102 and 103 which vary across the entire peak-to-peak range of source 101. Although simple in concept, this circuit can be difficult to realize in practice at low cost.

Figure 2:
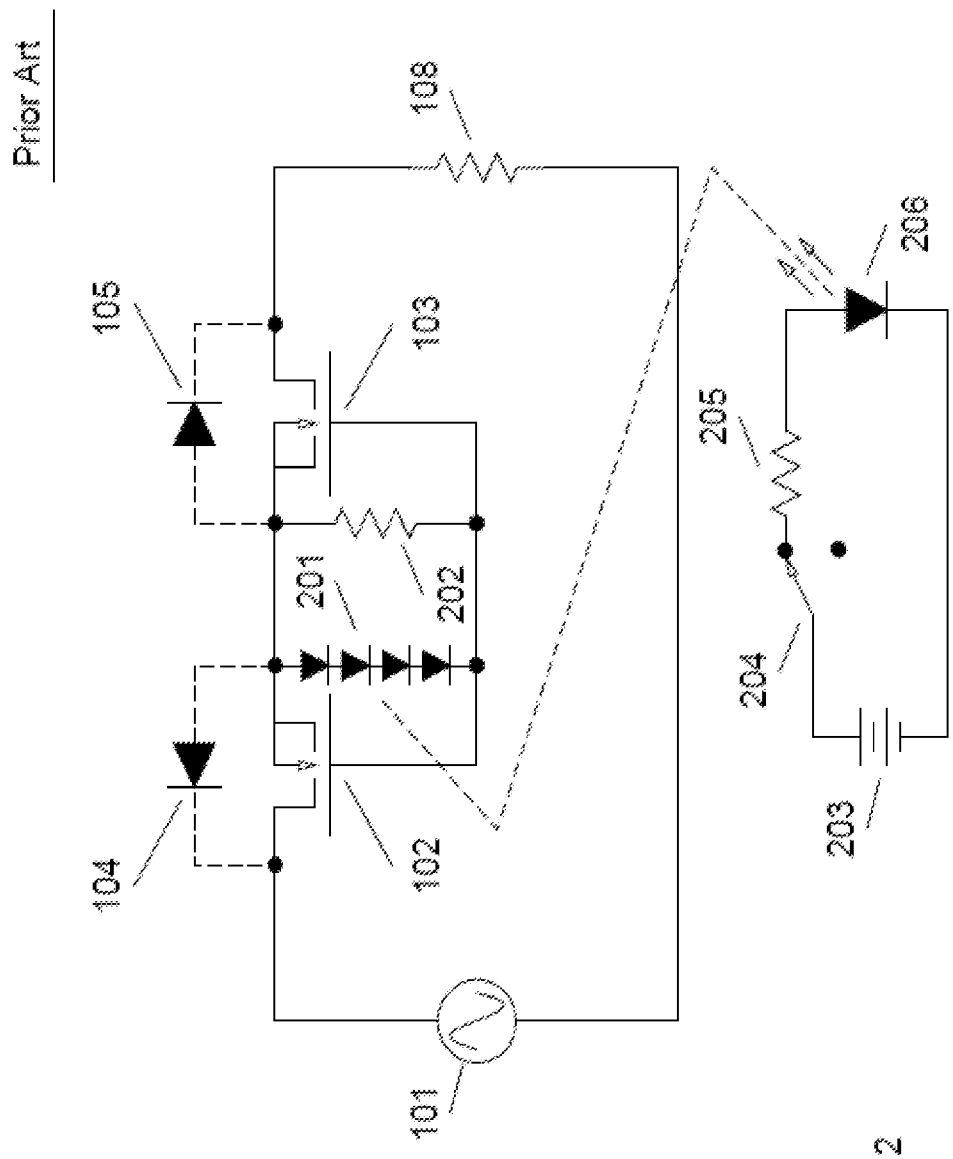
FIG. 2 is a schematic diagram of a prior art bidirectional switch using optoelectronic bias generation.

FIG. 2 shows a schematic diagram of a prior art approach to the control circuit. Voltage source 106 in FIG. 1 is replaced with a photovoltaic diode stack 201 that provides the needed gate-to-source bias voltage when illuminated by a light emitting diode (LED) 206 which is powered by a separate low voltage source 203 and controlled by switch 204 through current limiting resistor 205. Elements 203-206 are assumed to be within optical proximity of diode stack 201. When LED 206 is switched off, the voltage across diode stack 201 is drained through resistor 202 and the power MOSFETs enter the "off" state.

Although the circuit of FIG. 2 works for simple on-off switching applications, the time constants associated with charging and discharging the gate-to-source capacitance of the power MOSFETs through the bias circuitry are typically too large to effect phase control in 50/60 Hz AC mains.

Figure 3:
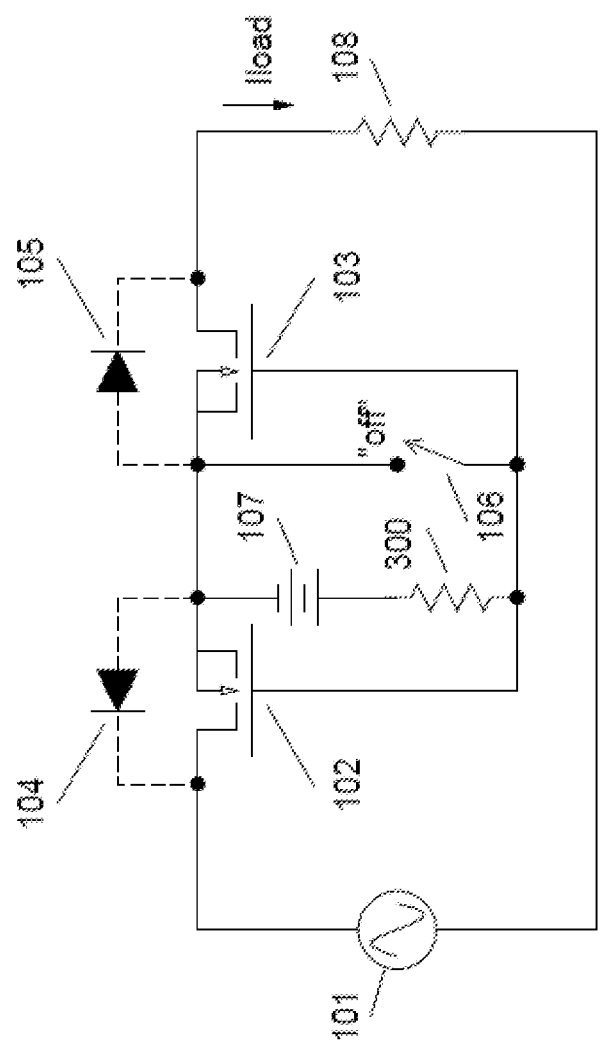
FIG. 3 is a schematic diagram of the basic elements of the improved bidirectional switch.

FIG. 3 is a schematic diagram showing the basic elements of the improved switch circuit. Although power MOSFETs are the preferred embodiment switching devices discussed in the following description, it will be apparent to one skilled in the art that other types of field-effect transistors can be advantageously employed in the improved circuit. As in FIG. 1, voltage 107 is used to bias power MOSFETs 102 and 103 into their "on" state. Opposite to the operation of the circuit in FIG. 1, the power MOSFETs are "on" only as long as switch 106 remains open. When switch 106 is closed the power MOSFETs are forced to enter their "off" state since their gates and sources are shorted together and voltage 107 is dropped across resistor 300.

Figure 4:
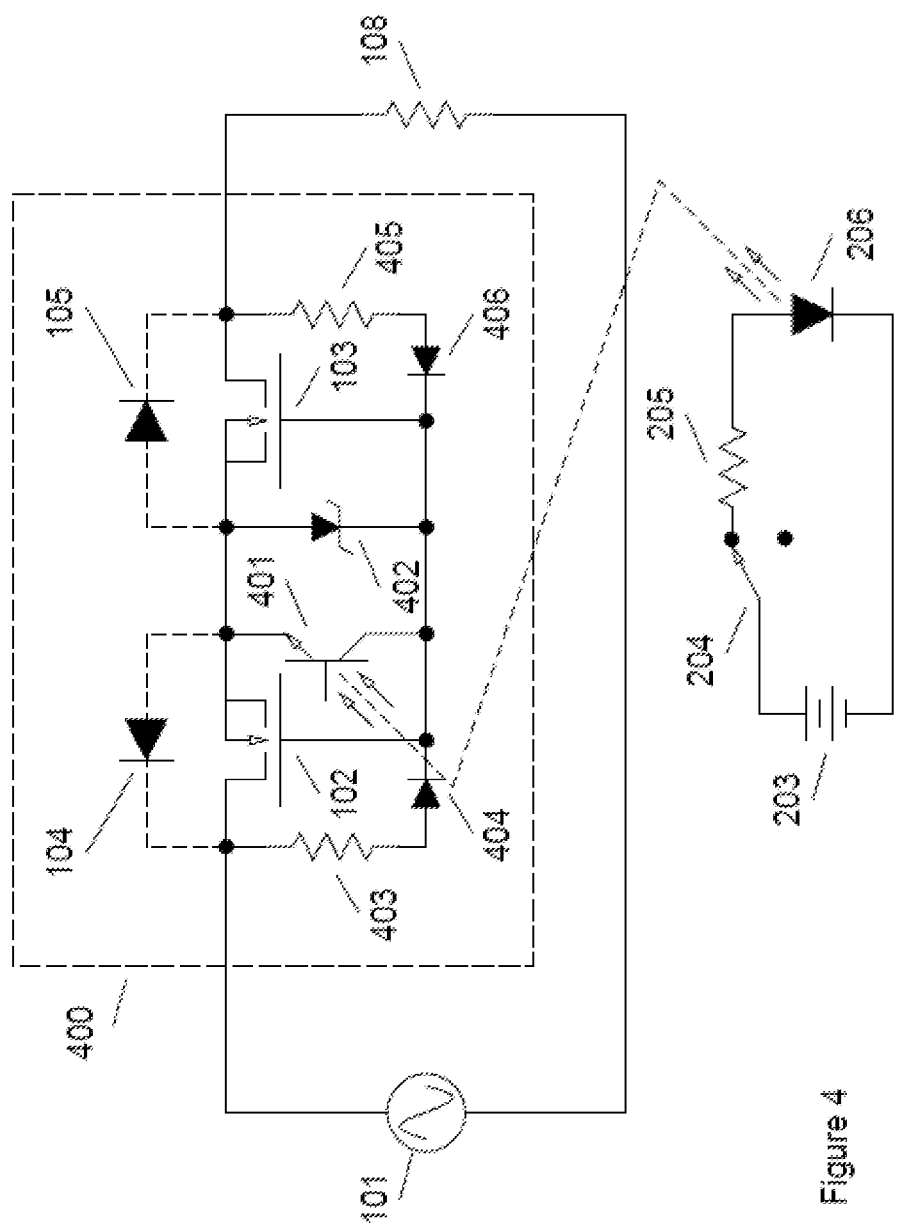
FIG. 4 is a schematic diagram of an embodiment of the improved bidirectional switch.
Figure 5:
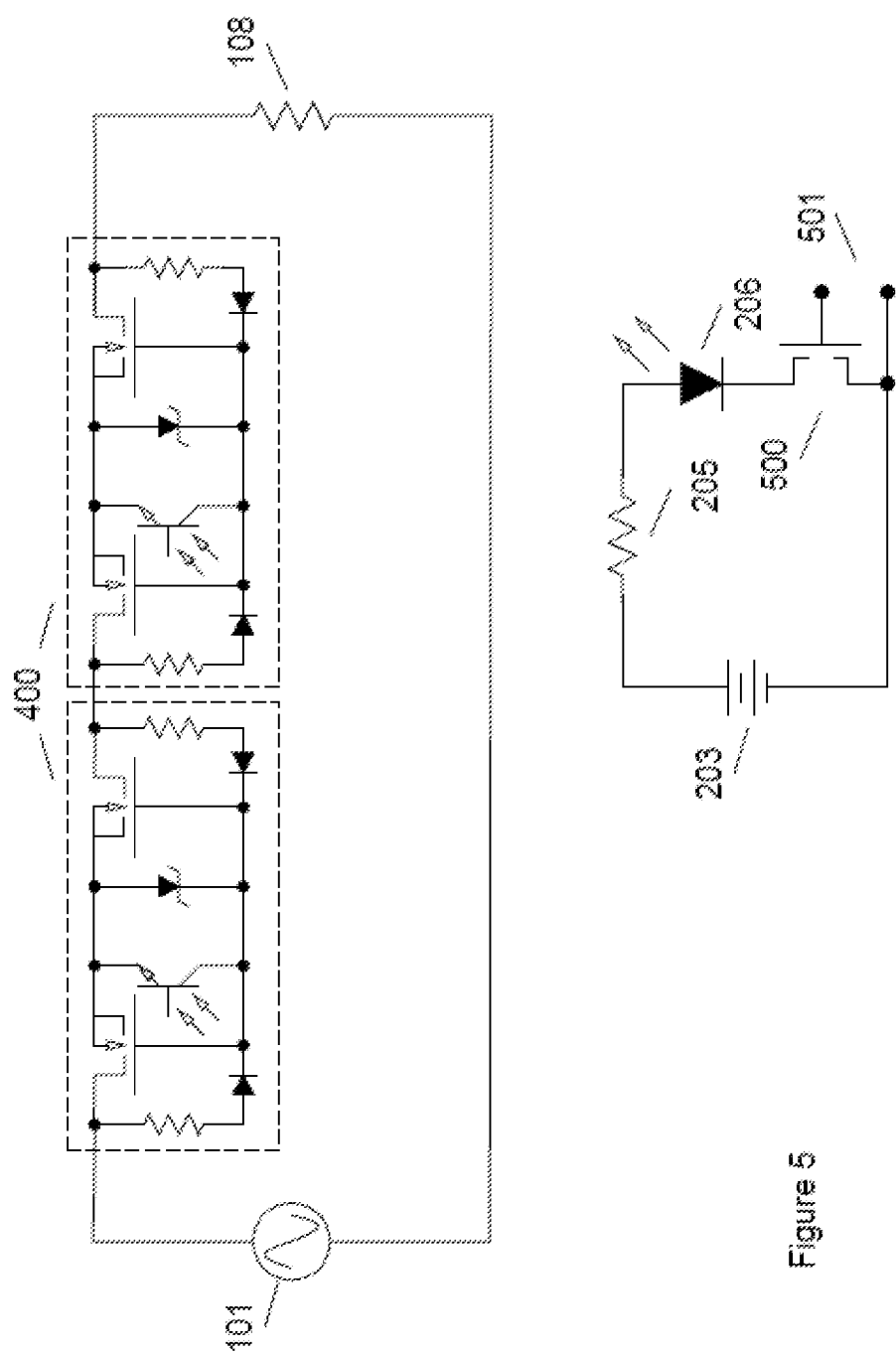
FIG. 5 is a schematic diagram of the embodiment of FIG. 3 using two switching elements to reduce total switch "on" resistance and increase total switch "off" resistance.

FIG. 4 is a schematic diagram showing an embodiment of the inventive circuit. Voltage source 106 in FIG. 1 is replaced in switching unit 400 with a Zener diode 402 having a Zener voltage greater than the threshold voltage of the power MOSFETs. Zener diode 402 is biased through rectifier diodes 404 and 406 connected at the drain terminals of the power MOSFETs and protected by current limiting resistors 403 and 405, respectively. Thus, in the absence of illumination resistor-diode branches 403-404 and 405-406 provide bias for Zener diode 402 when either of the drain terminals exceeds the Zener voltage, placing power MOSFETs 102 and 103 in the "on" state. When illuminated by LED 206 phototransistor 401 shunts the bias current from branches 403-404 and 405-406 to the source terminals of the power MOSFETS placing them in the "off" state. In this circuit the turn-on time constant is dictated by the value of the current limiting resistors 403 and 405 and the gate-to-source capacitance of the power MOSFETs, while the turn-off time constant is dictated by the saturation current of the phototransistor 401 at the illumination level provided by LED 206. Both of these time constants can be designed to be much shorter than the period of the AC mains, thereby allowing this embodiment to operate in both an on-off and a phase-control mode. FIG. 5 is a schematic diagram of the embodiment of FIG. 4 using two switch units 400 to improve the performance of the circuit. In this embodiment it is assumed that the power MOSFETs are selected to have half the breakdown voltage of the units used in FIG. 4. Thus, the on resistance of the individual switch units can be expected to be reduced by a factor of 5.7, as described above, and the total on resistance of the two switch units connected in series is reduced by a factor of 2.8 relative to the circuit in FIG. 4. Additionally, the voltage drop across each of the switch units in the "off" state is halved, thereby reducing the $dV_{ds}/dt$ experienced by each unit by a factor of two and consequently reducing the "off" state leakage current.

FIG. 5 also includes an electronic switch circuit to control the illumination of LED 206. The current through LED 206 from voltage source 203 is limited by resistor 205 and is controlled by transistor 500. Transistor 500 is controlled by an external control voltage applied to control terminals 501. This allows for the rapid switching of the LED in synchronism with the AC mains waveform through external control circuitry (not shown) to provide phase control of the applied AC waveform, as is used in dimmer applications. In another embodiment the control signal is a train of pulses synchronized with the AC mains waveform and having adjustable pulse widths to effectively control the average current/power delivered to the load, thereby providing a dimming effect for a light source load and a speed control for an AC motor load. In another embodiment the control signal is a train of pulses having a fixed or variable frequency independent of the AC mains waveform thereby generating a radio-frequency (RF) power waveform at the load terminals for use as a wireless charger/generator. In another embodiment the control signal is a variable DC voltage allowing variable illumination of the LED thereby allowing the MOSFETs to operate in a linear mode.

Figure 6:
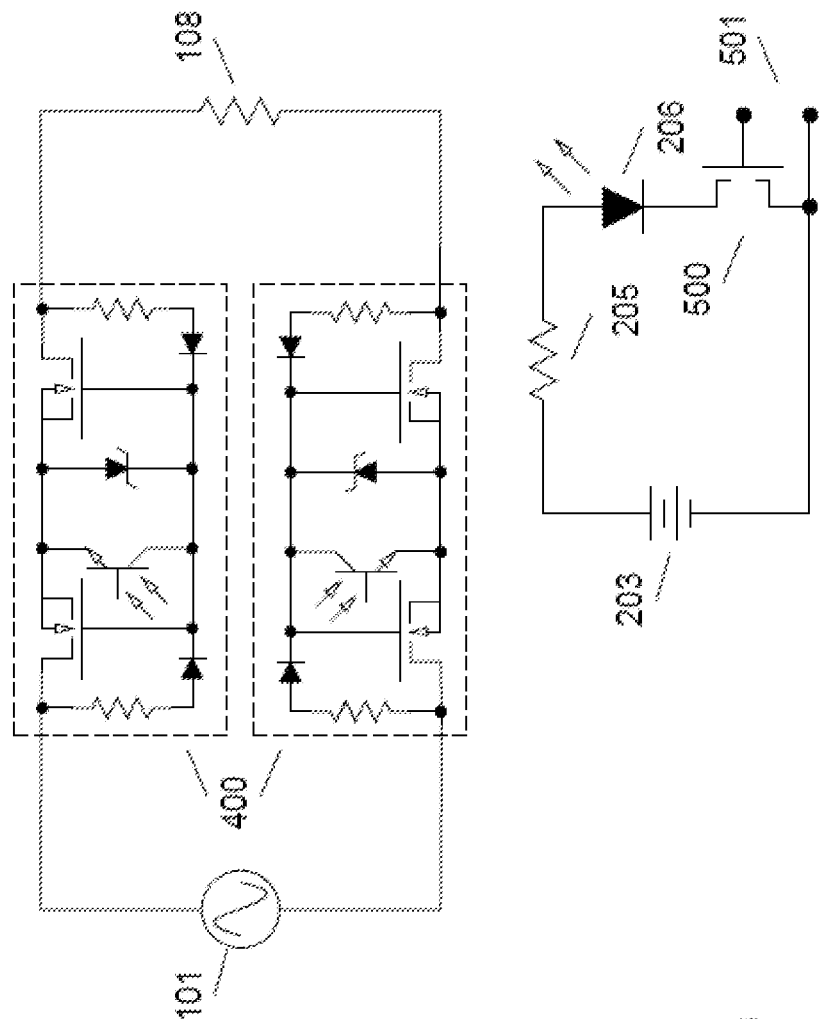
FIG. 6 is a schematic diagram of an embodiment similar to that of FIG. 3, but with the switching elements in both arms of the AC power supply.

FIG. 6 is a schematic diagram of an embodiment similar to that of FIG. 5, but with an individual switch unit 400 placed in each arm of the AC power supply. The inventor has found that this circuit configuration further improves the turn-off characteristics of the switch devices, further reducing leakage currents.

Figure 7:
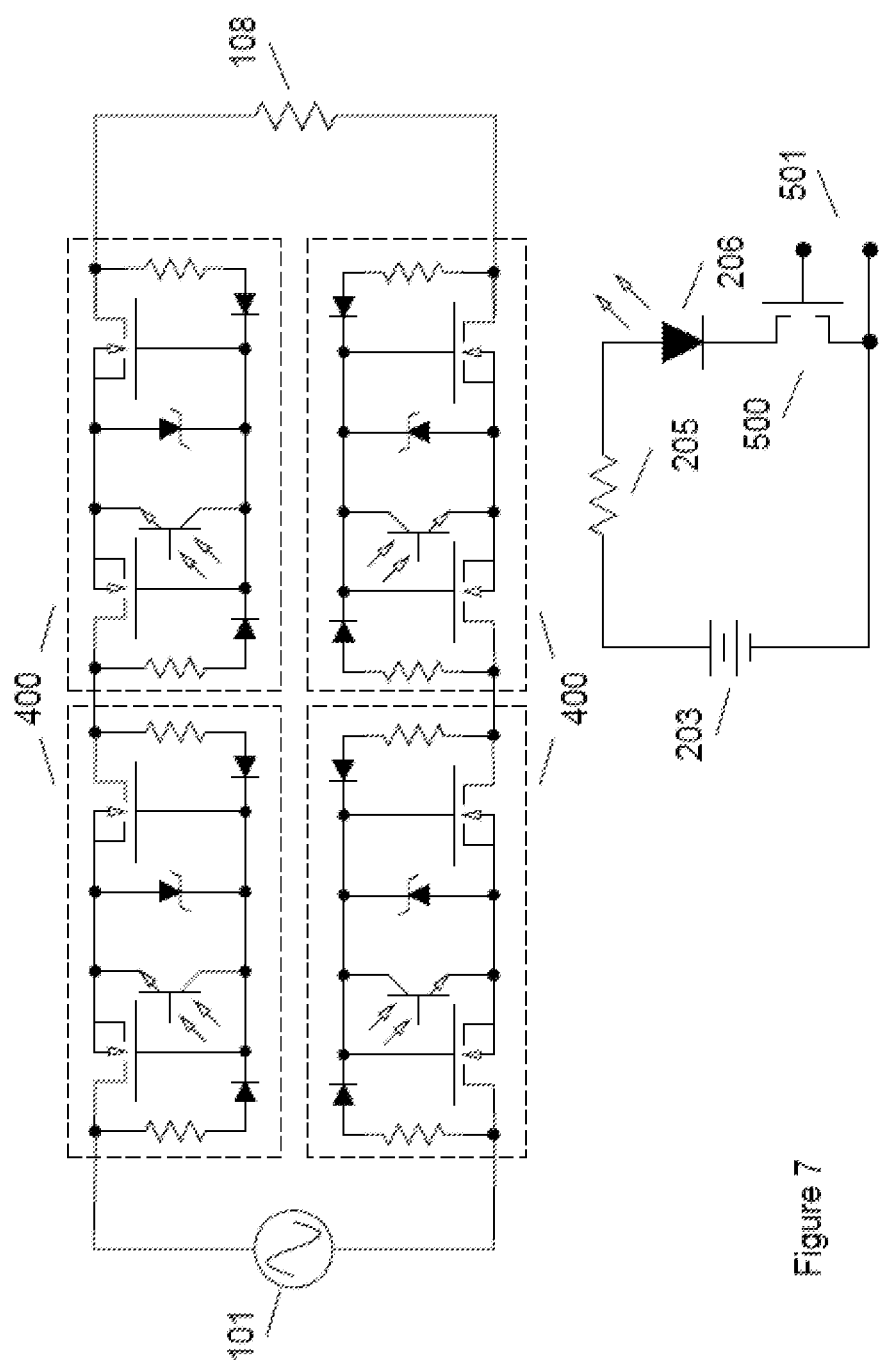
FIG. 7 is a schematic diagram of the embodiment of FIG. 5 using four switching elements to further reduce total switch "on" resistance and further increase total switch "off" resistance.

FIG. 7 is a schematic diagram of the embodiment of FIG. 6 using two switch units 400 in each arm of the AC supply to further improve the performance of the circuit. In this embodiment it is assumed that the power MOSFETs are selected to have one-fourth the breakdown voltage of the units used in FIG. 3. Thus, the on resistance of the individual switch units can be expected to be reduced by a factor of 32, as described above, and the total on resistance of the two switch units connected in series is reduced by a factor of 8 relative to the circuit in FIG. 4. Additionally, the voltage drop across each of the switch units in the "off" state is quartered, thereby reducing the $dV_{ds}/dt$ experienced by each unit by a factor of four and consequently further reducing the "off" state leakage current relative to the circuit in FIG. 4. As mentioned above, the inventor has found that this circuit configuration further improves the turn-off characteristics of the switch devices, further reducing leakage currents.

Figure 8:
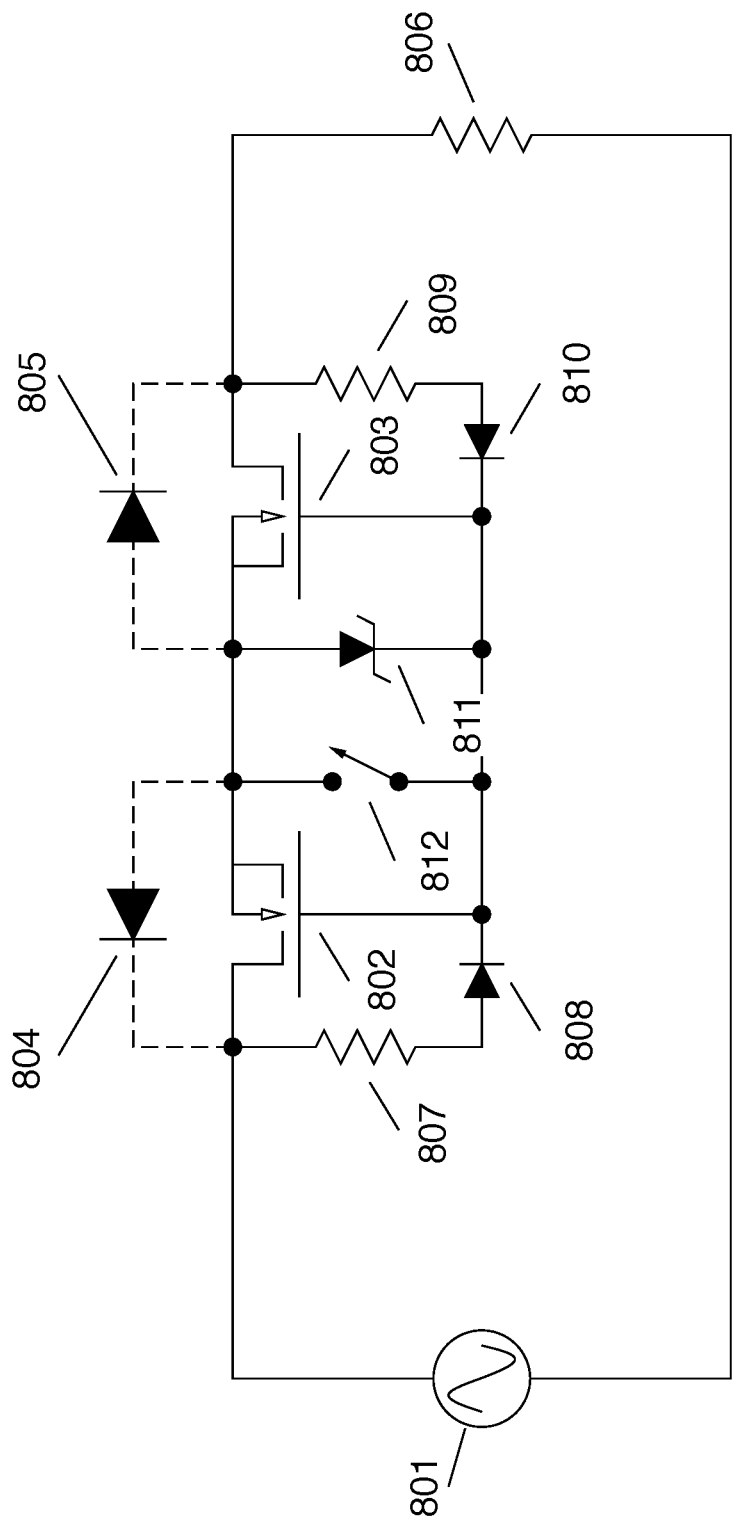
FIG. 8 is a schematic diagram showing an improved power MOSFET bidirectional switch.
Figure 9:
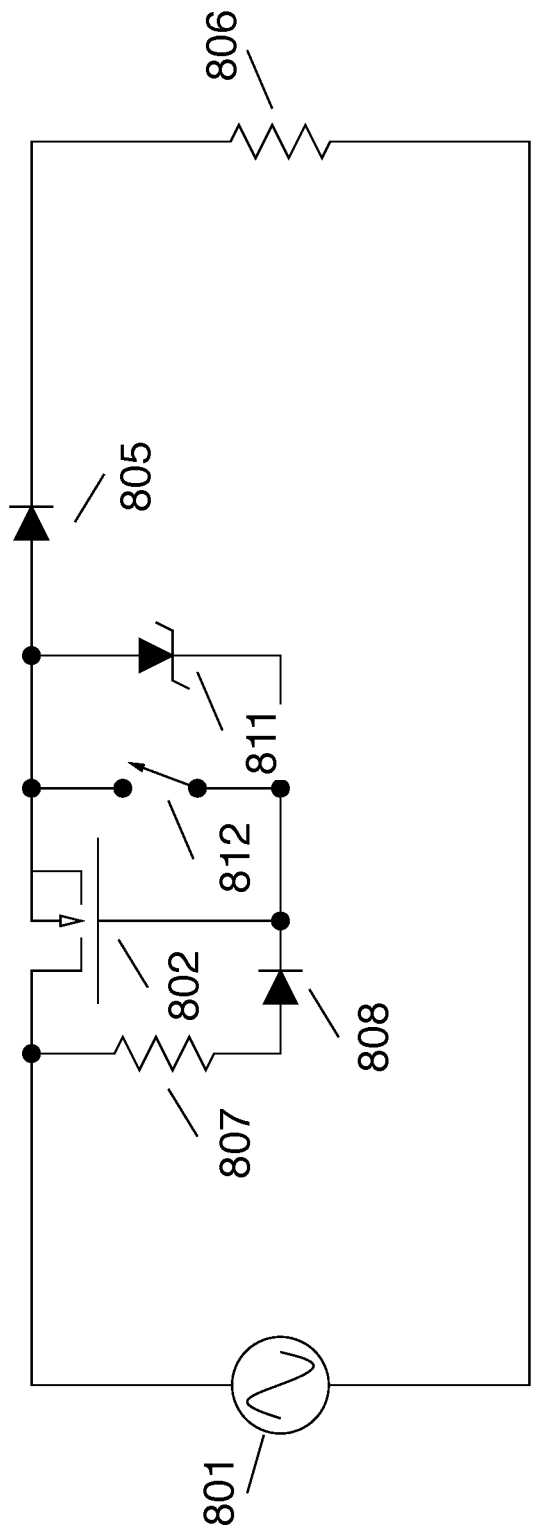
FIG. 9 shows the active components of FIG. 8 when the voltage source is in the positive half-cycle of the ac mains waveform.

A known issue with prior art MOSFET switches is parasitics of the MOSFETS. In some cases the parasitics result in the inability to complete shutoff power to the load. FIGS. 8 through 13 show improvements in the electronic switches as already described to overcome the effect of the parasitics by compensation or elimination. The improvements include changes to the architecture of the system and changes to the internal components of the switches themselves. FIG. 8 is a schematic diagram showing the basic power MOSFET bidirectional switch controlling the power delivered from AC source 801 to load 806. Power MOSFETs 802 and 803 include body diodes 804 and 805, respectively. Zener diode 811 exhibits a Zener voltage greater than the threshold voltage, $V_T$, of the power MOSFETs 802 and 803. Zener diode 811 is biased through rectifier diodes 808 and 810 connected at the drain terminals of the power MOSFETs and protected by current limiting resistors 807 and 809, respectively. Thus, when switch 812 is open, resistor-diode branches 807-808 and 809-810 provide bias for Zener diode 811 when either of the drain terminals exceeds the Zener voltage, thereby placing power MOSFETs 802 and 803 in the "on" state. When closed, switch 812 shunts the bias current from branches 807-808 and 809-810 to the source terminals of the power MOSFETS placing them in the "off" state. In this circuit the turn-on time constant is dictated by the value of the current limiting resistors 807 and 809 and the gate-to-source capacitance of the power MOSFETs, while the turn-off time constant is dictated by the MOSFET capacitances and the on-resistance of switch 812. Both of these time constants can be designed to be much shorter than the period of the AC mains, thereby allowing this embodiment to operate in both an on-off and a phase-control mode. In practice, however, the Zener diode 811 never reaches its Zener voltage, and the gate-source voltage of MOSFETs 802 and 803 rarely exceeds the threshold voltage, $V_T$. Thus, neither MOSFET 802 or 803 is fully "on" resulting in excess power dissipation in the units and reduced current supplied to the load 806. FIG. 9 shows the active components of FIG. 8 when the voltage source 801 is in the positive half-cycle of the ac mains waveform. When switch 812 opens to allow MOSFET 802 to enter its "on" state, the gate voltage of MOSFET 802 begins to follow the positive excursion of source 801 while the source voltage is at zero volts. When the gate voltage reaches the threshold voltage of MOSFET 802, current begins to flow to load 806 and body diode 805 from MOSFET 803 is forward biased. The source voltage of MOSFET 802 then "follows" the rise in the gate voltage, lagging it by the value of the threshold voltage plus an additional bias to account for the current supplied to the load. This condition is maintained until the waveform of source 801 becomes negative. Consequently, the drain-to-source voltage of MOSFET 802 never falls below its threshold voltage, regardless of the drain-to-source resistance of the device, and the power dissipated in the switch is $I_D*V_T$. If the gate voltage can be boosted well beyond the threshold voltage, the the dissipated power is given by $I_D^2*r_{ds}$, where $r_{ds}$ is the "on" resistance of the switch. This value can be much smaller than $I_D*V_T$.

Figure 10:
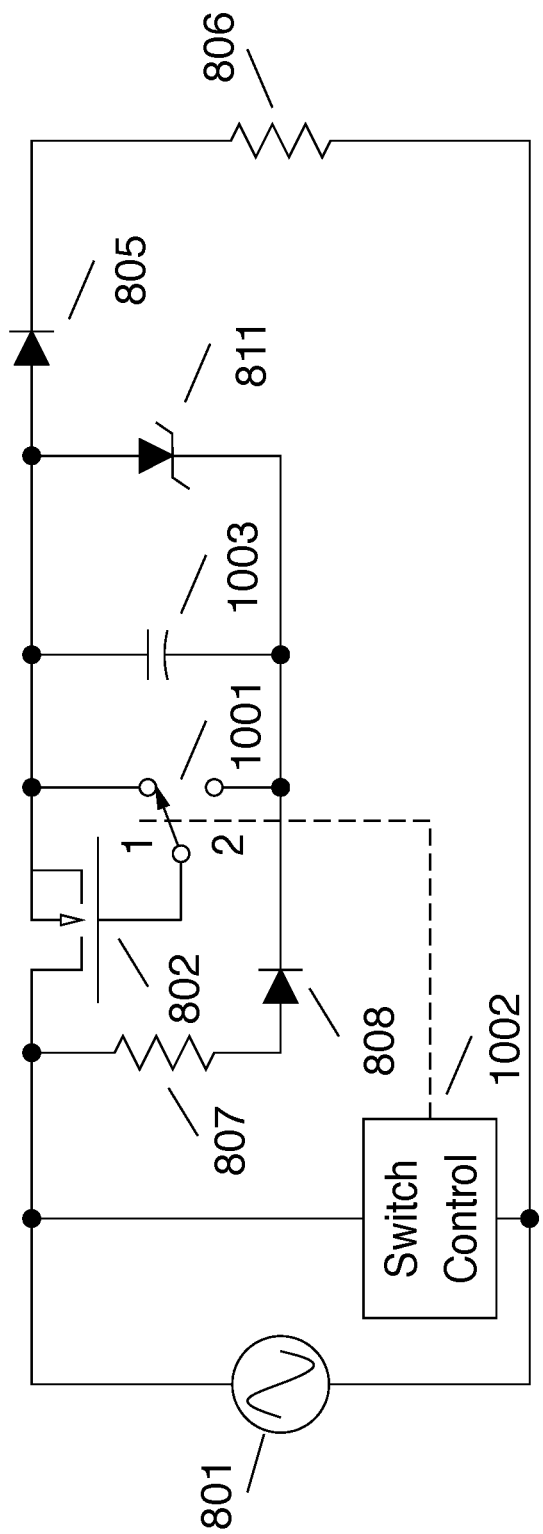
FIG. 10 shows a schematic of the half switch shown in FIG. 9 that allows a boost of the gate voltage.

FIG. 10 shows a schematic of the half switch shown in FIG. 9 that allows a boost of the gate voltage. It differs from the circuit of FIG. 9 in the replacement of switch 812 with a 2-pole switch 1001 which allows the gate of MOSFET 802 to be connected either to its source or to the bias circuit 807-808. The bias circuit also includes capacitor 1003 connected in parallel with Zener diode 811. Switch 1001 is controlled by Switch Control circuit 1002 that maintains the switch 1001 in either position 1, corresponding to MOSFET 802 set in its "off" condition, or in position 2, which connects the gate to the bias circuit. Switch Control circuit 1002 is designed to keep switch 1001 in position 1 until the AC source 801 waveform exceeds a pre-established trigger level, $V_{trig}$, whereupon it switches 1001 to position 2. Thus, switch 1001 and Switch Control circuit 1002 keep MOSFET 802 in its "off" state until the AC voltage waveform reaches the trigger level, $V_{trig}$, which allows the bias circuit to charge to $V_{trig}$ while the source of MOSFET 802 remains at 0 volts. When switch 1001 changes state, the bias voltage, $V_{trig}$, is applied to the gate which value can be much larger than the threshold voltage, $V_T$. The source of MOSFET 802 begins charging towards $V_{trig}$-$V_T$, and part of this voltage step is coupled to the gate through capacitor 1003. This increases the gate bias well beyond $V_{trig}$ so that it exceeds the AC source 801 voltage value. Thus, MOSFET 802 reaches a state where the drain-to-source voltage is nearly zero, while the gate-to-source voltage is larger than $V_{trig}$. In this state MOSFET 802 exhibits its minimum channel resistance, $r_{ds}$, and maximum voltage appears across load 806.

Figure 11:
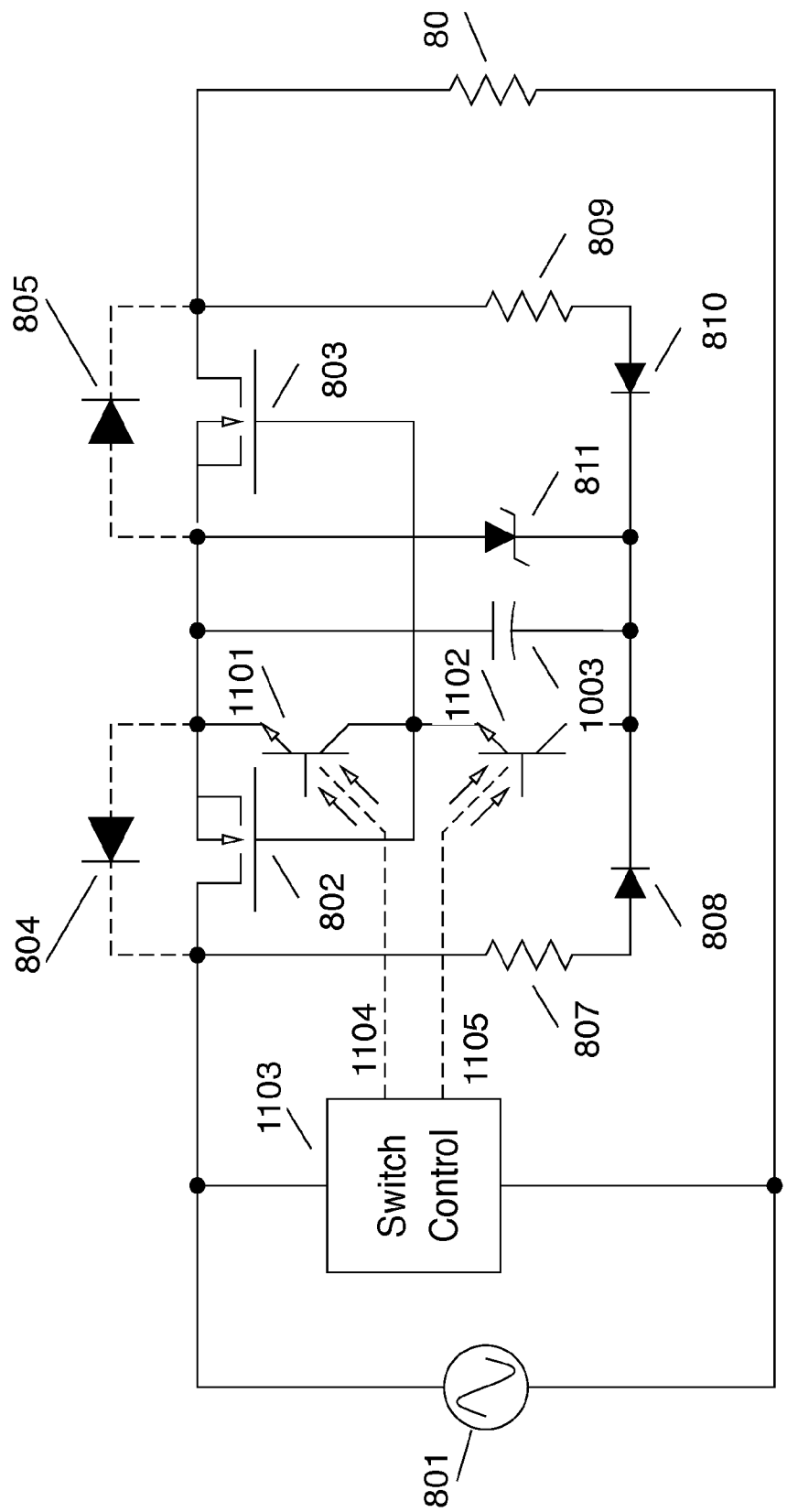
FIG. 11 illustrates an embodiment of the circuit of FIG. 10 in a fully bidirectional switch configuration.

FIG. 11 illustrates an embodiment of the circuit of FIG. 10 in a fully bidirectional switch configuration. Switch 1001 is replaced with a pair of electronic control switches 1101 and 1102 that are controlled by an expanded Switch Control circuit 1103 having outputs 1104 and 1105 that drive 1101 and 1102, respectively. In the preferred embodiment, the switches 1101, 1102 are optical transistors. As in FIG. 10, the expanded Switch Control circuit 1103 is characterized by a trigger level, Vtrig, that provides optical excitation via output 1104 if the absolute value of the AC mains source voltage level is less than Vtrig, and via output 1105 otherwise. The switch control is programmed such that the optical drive signals 1104, 1105 do not overlap, thereby providing a "break before make" switch characteristic and avoids discharging capacitor 1003 prematurely.

The time constant for the switch control allows for the rapid switching of the optical drive signals in synchronism with the AC mains waveform through external control circuitry (not shown) to provide phase control of the applied AC waveform, as is used in dimmer applications. In another embodiment the control signal is a train of pulses synchronized with the AC mains waveform and having adjustable pulse widths to effectively control the average current/power delivered to the load, thereby providing a dimming effect for a light source load and a speed control for an AC motor load. In another embodiment the control signal is a train of pulses having a fixed or variable frequency independent of the AC mains waveform thereby generating a radio-frequency (RF) power waveform at the load terminals for use as a wireless charger/generator. In another embodiment the control signal is a variable DC voltage allowing variable illumination of the LED thereby allowing the MOSFETs to operate in a linear mode. In a preferred embodiment the switch control circuit receives a control signal from a control signal source, and the switch control circuit optical drive signals are pulsed in synchronism with the AC power source to provide phase control of the AC power to the load. In another embodiment, the optical drive signal is a train of pulses synchronized with the AC mains waveform and having adjustable pulse widths to effectively control the average current/power delivered to the load, thereby providing a dimming effect for a light source load and a speed control for an AC motor load.

Figure 12:
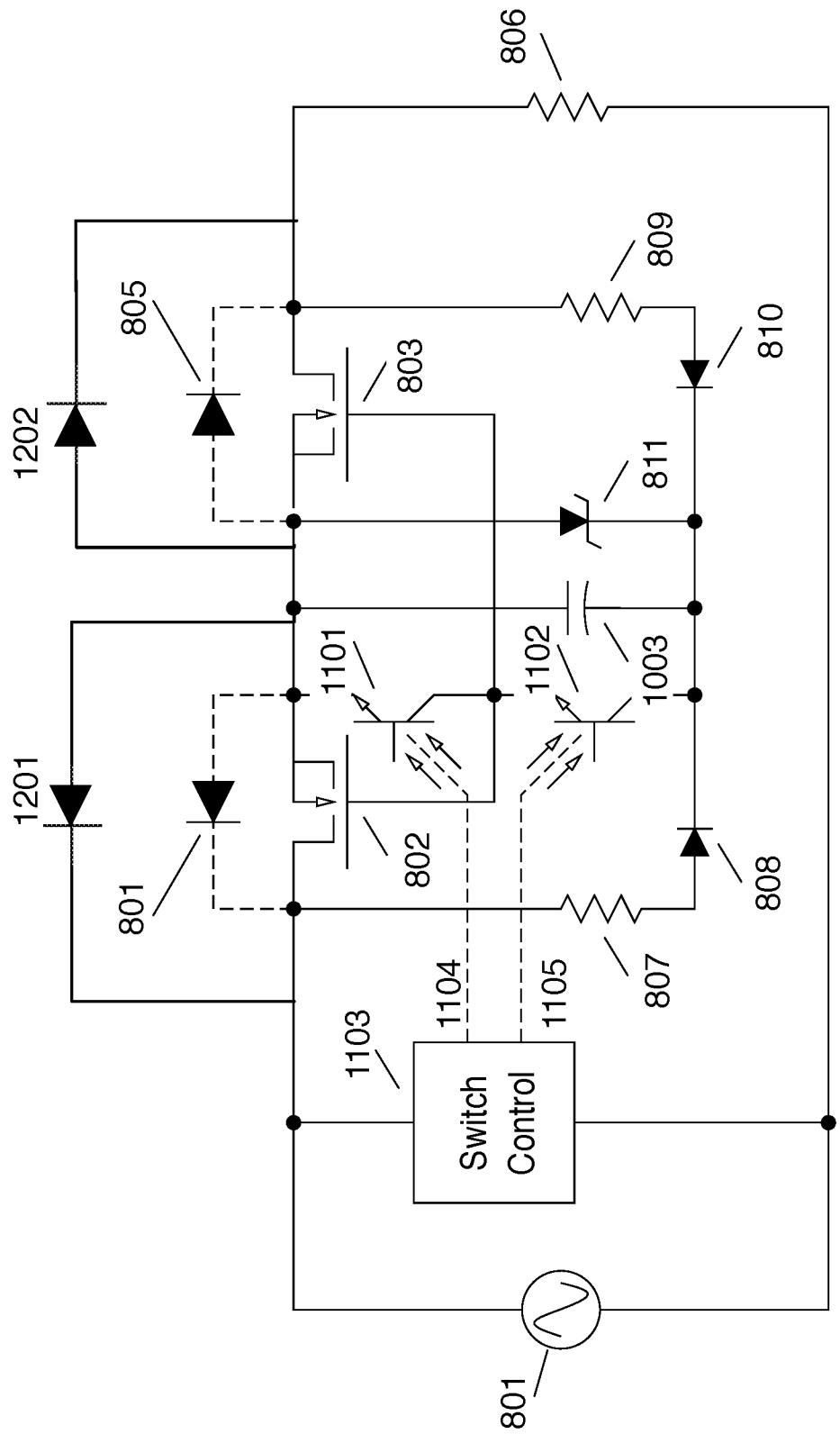
FIG. 12 shows the bidirectional switch of FIG. 11 further including bypass diodes.

In another embodiment shown in FIG. 12, the bidirectional switch of FIG. 11 further includes bypass diodes 1201, 1202 which can bypass the intrinsic diodes 804, 805 of the MOSFETs 802, 803. All other components are consistently numbered and as discussed in previous FIGS. 8-11.

Figure 13:
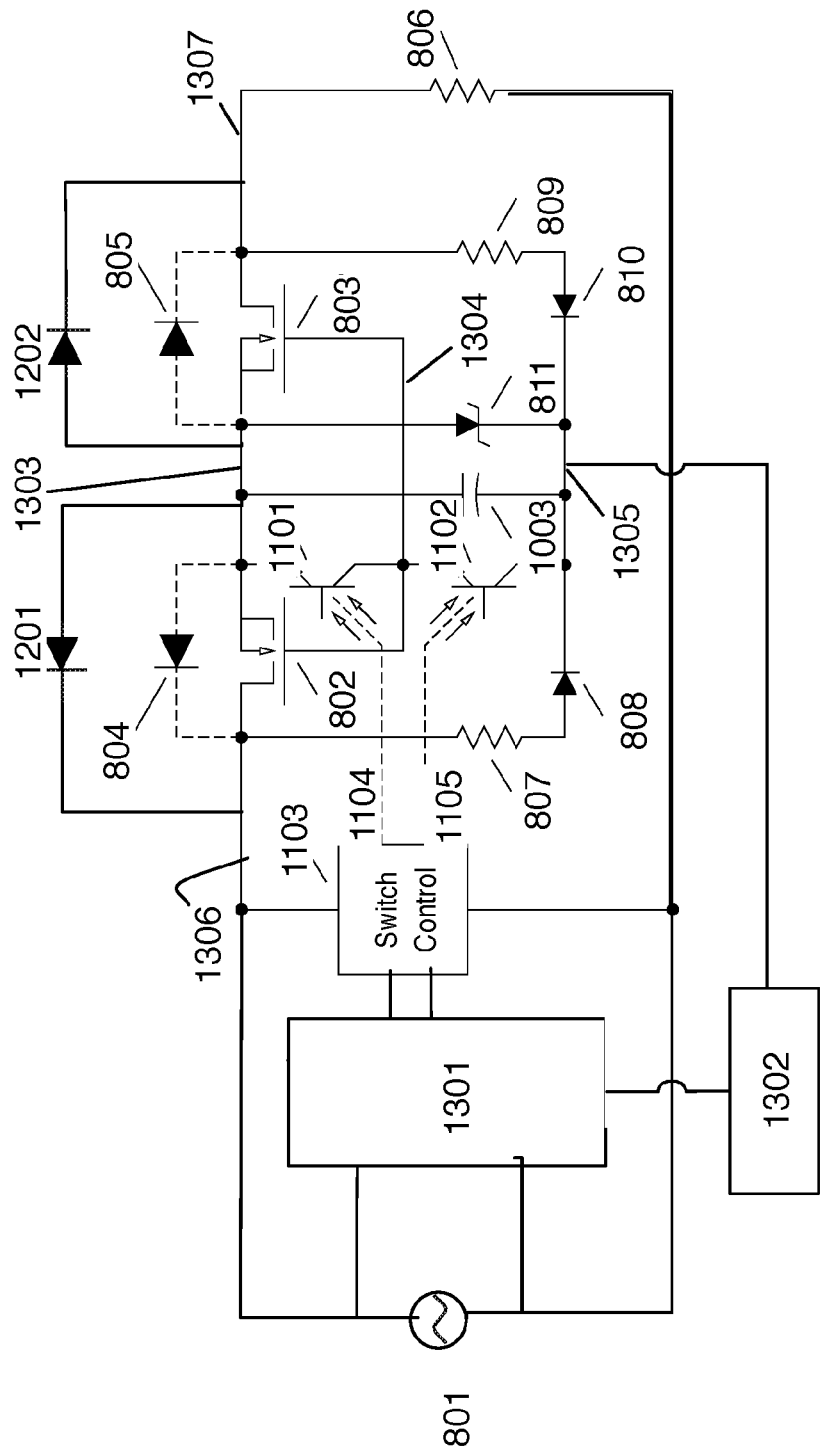
FIG. 13 shows power to the switch control provided by a low voltage AC to DC converter.

In another embodiment shown in FIG. 13 power to the switch control 1103 is provided by a low voltage AC to DC converter 1301. The AC to DC converter is in turn controlled by a current sensor 1302 such that the AC to DC converter and therefore the Switch control are turned off if no current is sensed in the bi-directional switch comprised of MOSFETs 802, 803. All other components are consistently numbered and as discussed in previous FIGS. 8-12. To summarize, the solid state bidirectional switch comprises: first and second series connected electronic switch devices 802, 803, each switch device having a drain terminal, a source terminal and a gate terminal and being characterized by a threshold voltage specified between the gate terminal and the source terminal, wherein the drain terminal of the first switch device comprises the input terminal 1306 of the solid state bidirectional switch and drain terminal of the second switch devices comprise the output terminal 1307 of the solid state bidirectional switch, the source terminals of the first and second switch devices are interconnected at a first control terminal 1303 and the gate terminals of the first and second switch devices are interconnected at a second control terminal 1304, and, a first control switch 1101 connected between the first control terminal and the second control terminal, and a bias terminal 1305 connected to the second control terminal through a second control switch 1102, and a voltage regulator device 811 connected between the bias terminal and the first control terminal, and a capacitor 1003 connected in parallel with the voltage regulator device, and a first rectifier device 808 connected from the input terminal of the switch circuit to the bias terminal through a first current limiting resistor 807, and, a second rectifier device 810 connected from the output terminal of the switch circuit to the bias terminal through a second current limiting resistor 809, and, a switch control circuit 1103 that controls the first control switch and the second control switch, such that first control switch is closed when the second control switch is open and vice versa.

Figure 14:
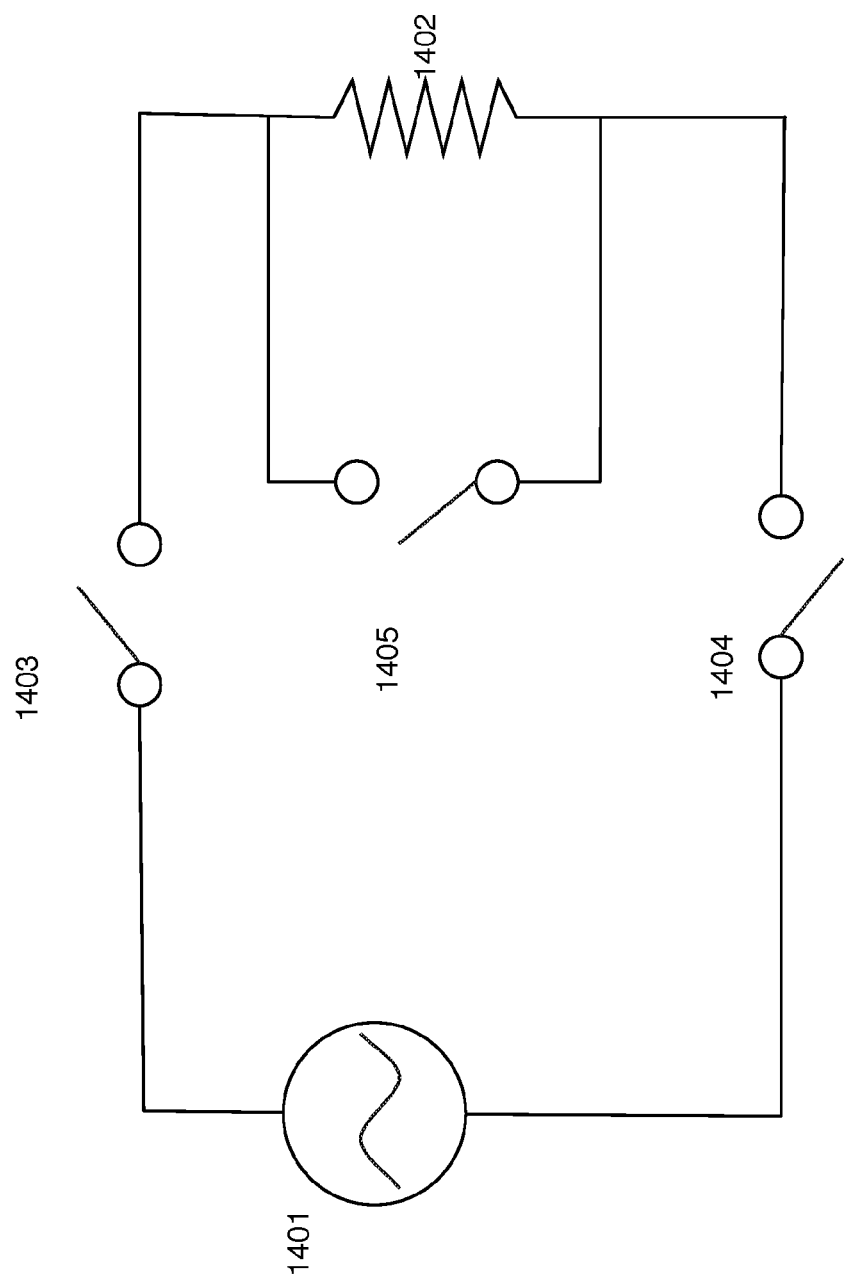
FIG. 14 shows bidirectional switches, as described above, located between the source and the load.

In another embodiment shown in FIG. 14, bidirectional switches 1403-1405, as described above are located between the source 1401 and the load 1402 and included in the line 1403 and the return 1404 as well as a bidirectional switch 1405 that bypasses the load 1402. Switch 1405 is closed when switch 1403 is open.

AC to DC Converter

In one embodiment, the AC to DC converter 1301 of FIG. 13 is comprised, as is known in the art, of a rectifier comprised of diode array and a step down transformer. In a preferred embodiment the AC to DC converter does not use a rectifier or transformer is comprised of elements as described in FIGS. 15 and 16.

Figure 15:
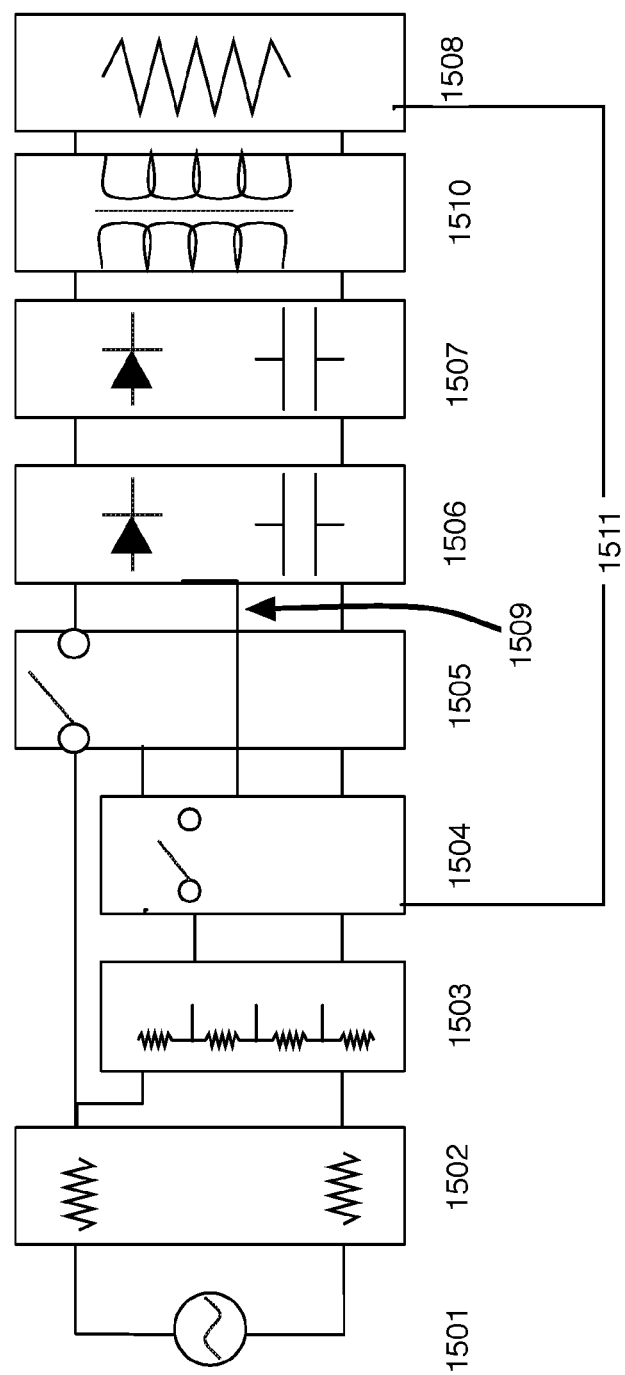
FIG. 15 shows the AC to DC converter.
Figure 16:
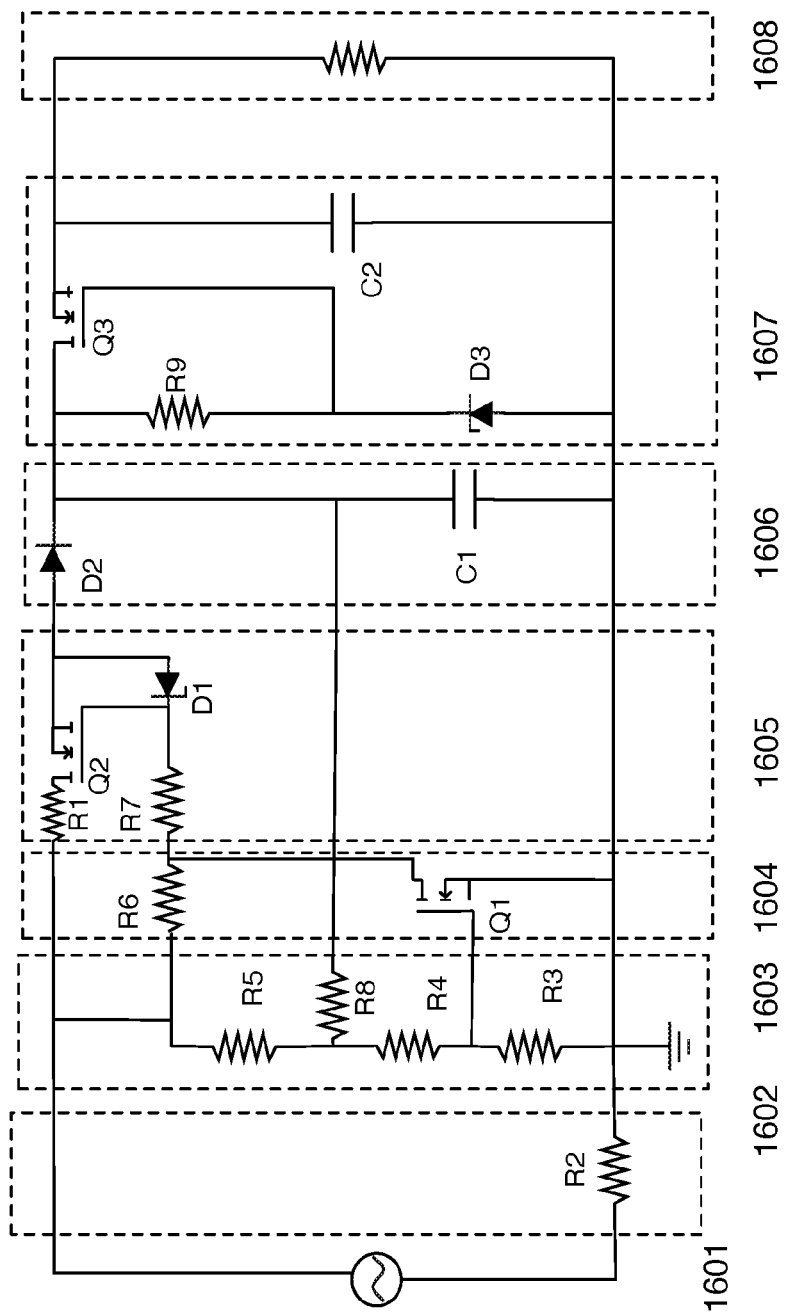
FIG. 16 shows the preferred embodiment of the AC to DC converter.

The AC to DC converter, that does not require a rectifier, is comprised, generally, of the elements shown in FIG. 15 and the method implied by these elements. A non-limiting specific example of the circuit elements is shown in FIG. 16. Referring to FIG. 15 the AC source 1501 is connected to an inrush protection element 1502. In one embodiment the inrush element is comprised of resistor elements in the line and neutral of the AC supply. In another embodiment, where higher power and efficiency is required the inrush protection includes switch elements that provide high resistance at startup and switch the resistor elements out of the circuit at steady state operation. After the inrush protection the AC source is sampled using a sampling element 1503. In one embodiment the sampling element 1503 includes resistors configured into a voltage divider network. In another embodiment the sampling element includes a reference voltage source and comparator. In another embodiment the sampling element can be manually adjusted. In another embodiment the sampling element can be automatically adjusted. The sampled voltages are used as supply to a switch driver element 1504. In the preferred embodiment, the switch driver element 1504 receives a feedback voltage signal 1509 from the storage element 1506 and based upon the voltage signal, controls the voltage applied to the gate of a switching element in the control switch and clamp element 1505, thereby opening and closing the control switch 1506 to supply power to the storage element 1506 and ultimately the load 1508. In one embodiment, where the feedback 1509 is removed, the AC to DC converter is a feed forward converter where charging of the storage element 1506 is controlled from the the forward side 1503, 1504 and 1505. Addition of the the feedback control 1509 provides a means for both feed forward and feedback control. In one embodiment the balance of feed forward and feedback control is determined by the selection of components in the voltage sampling element 1503 and the feedback line 1509. In one embodiment the balance of feedforward and feedback control is determined by resistor elements in the sampling element 1503 and the feedback 1509. In another embodiment variable elements are used such that the feedforward and feedback control can be adjusted. In a preferred embodiment the switch driver is comprised of a voltage divider and a switch. The switch and clamp element 1505 controlled by the switch driver 1504 provides pulsed power at a fixed maximum current to the storage element 1506. In the preferred embodiment the switch and clamp element is comprised of an N-MOSFET and a Zener diode, connected source to gate, limits/clamps the peak voltage, and therefore peak current, to a pre-selected peak voltage value. In one embodiment the preselected limiting voltage is determined by value of the Zener voltage of the Zener diode bridging gate to source of an N-MOSFET component of the switch 1505. Power from the switch and clamp element comprised of pre-selected peak current pulse is provided to a storage element 1506. In one embodiment the voltage regulator is comprised of a capacitor used as an energy storage element and a diode. Charge on the capacitor is fed back through a voltage divider circuit to the switch driver 1504 thereby maintaining a constant charge on the capacitor. Output from the the storage element is fed through a voltage regulator 1507 to the load 1508. In another embodiment the AC to DC converter further includes a galvanic isolation element 1510. In another embodiment the AC to DC converter further includes elements 1511 that enable feedback from the load 1508. In the preferred embodiment the feedback circuit 1511 also includes galvanic isolation between the control element 1504 and the load 1508.

FIG. 16 shows the preferred embodiment of the AC to DC converter. Elements 1601 through 1608 correspond to elements 1501 to 1508 of FIG. 15 respectively. The AC source is connected to the inrush protection circuit 1601 comprised in this preferred embodiment of resistors R1 and R2. In another embodiment (not shown) the inrush protection includes switches such that the current flows through the resistors R1 and R2 at startup and bypasses the resistors once steady state operation is reached. In another embodiment the inrush control uses inductors; that is elements R1 and R2 are replaced with inductors L1 and L2. Output from the inrush protection goes to the switch Q2 of the switch and clamp circuit 1605 and to the voltage sampling element 1603. The voltage sampling element 1603 is comprised of resistors R3, R4, R5 sampling the AC input and resistor R8 providing a feedback voltage from storage capacitor C1. The values of R3, R4, R5 and R8 are selected such that the voltage to the gate of switch Q1 in the switch driver element 1604 turns switch Q1 on and off and thereby synchronously turns switch Q2 off and on thereby providing a preselected timed output pulse from switch Q2 to charge storage element C1. Resistor R8 provides a feedback path as to the charge on capacitor C1 and therefore the output voltage to the voltage sampling circuit 1603 and therefore to the control circuit 1604. The switch and clamp element 1605 is comprised of switch Q2, Zener Diode D1 and resistor R7. The switch Q2 is controlled by the switch driver circuitry 1604. The peak output current of switch Q2 is clamped to a preselected value based upon the selected values of the Zener voltage of diode D1. Pulsed output from the switch Q2 is connected to the voltage regulator 1606 which through the feedback of R8 to the voltage sampling 1603 and the switch driver 1604 holds capacitor C1 to a constant charge. Control element switch Q1 and therefore supply switch Q2 are activated, either opened or closed, in synch with the AC input. The AC to DC converter provides a low voltage output with pulse modulation at the frequency of the incoming AC source. The switches are activated, either opened or closed, at voltages that are near, within the threshold values for the components Q1 and Q2, of the zero crossing of the AC source. The Output then goes to voltage regulator 1607 and then load 1608. The voltage regulator 1607 includes switch Q3, Zener diode D3 resistor R9 and capacitor C2. Circuit components D3, Q3, R9 function as a voltage regulator equivalently to that already described for circuit elements 105, 104, 106 respectively in FIG. 1. Capacitor C2 provides storage capacity to buffer and thereby smooth the output from the AC to DC converter to the load 1608.

The AC to DC converter in the preferred embodiment of FIGS. 15 and 16 is comprised of elements of inrush protection 1502, voltage sampling 1503, a switch driver 1504, a switch and clamp 1505, a storage element 1506 and a voltage regulator 1507. Selection of components in the voltage sampling 1503 determine the timing of the switch driver 1504.

Selection of elements in the switch and clamp determine a peak voltage and current for out pulses. Power output is controlled by selection of both the peak current and the pulse timing. Feedback from the storage element through the voltage sampling is used to select the pulse timing. The AC to DC converter operates in sync with the AC source.

The preferred embodiment of FIGS. 15 and 16 include in general a voltage divider 1503 connected to the power source 1501, and, a first switch 1504 connected through its input to the voltage divider, and, a second switch 1505 whose input is connected to the output of the first switch, and, a storage capacitor C1 connected through a diode to the output of the second switch, and, a sense resistor connected 1509 between the storage capacitor and the voltage divider thereby providing feedback control of the AC direct to DC extraction conversion system, and, a Zener diode D1 connected between the input and output of the second switch thereby clamping the voltage of the output and input of the second switch to the Zener voltage of the Zener diode, and, the electronic load 1508 connected to the storage capacitor C1. The switches 1504, 1505 may be any electronically actuated switch. In one embodiment the switches are N-MOSFETs. In another embodiment the switches are bipolar transistors and in another embodiment the switches are microelectromechanical switches.

Summary

A bidirectional switch for the control of power from an AC source to a load is described. The approach uses power MOSFETs in a bidirectional switch subcircuit configuration having an optically coupled, electrically floating control circuit that self-biases the switches into the "on" state and uses an optically coupled control element to force the switches into the "off" state. The time constant of the control circuit is fast enough to allow phase control as well as on-off control. A boost circuit is included to ensure that the control voltage exceeds a threshold voltage of the MOSFETs to force an off state. A plurality of subcircuits can be easily cascaded to provide improved performance.

We claim:

1. A bidirectional switch comprising:
   a. first and second series connected electronic switch devices (802, 803), each switch device having a drain terminal, a source terminal and a gate terminal and being characterized by a threshold voltage specified between the gate terminal and the source terminal, wherein the drain terminal of the first switch device comprises the input terminal (1306) of the solid state bidirectional switch and drain terminal of the second switch devices comprise the output terminal (1307) of the solid state bidirectional switch, the source terminals of the first and second switch devices are interconnected at a first control terminal (1303) and the gate terminals of the first and second switch devices are interconnected at a second control terminal (1304), and b. a first control switch (1101) connected between the first control terminal and the second control terminal, and c. a bias terminal (1305) connected to the second control terminal through a second control switch (1102), and d. a voltage regulator device (811) connected between the bias terminal and the first control terminal, and e. a capacitor (1003) connected in parallel with the voltage regulator device, and f. a first rectifier device (808) connected from the input terminal of the switch circuit to the bias terminal through a first current limiting resistor (807), and g. a second rectifier device (810) connected from the output terminal of the switch circuit to the bias terminal through a second current limiting resistor (809), and h. a switch control circuit (1103) having a control signal that controls the first control switch and the second control switch, such that first control switch is closed when the second control switch is open and vice versa.

2. The bidirectional switch of claim 1 wherein the first control switch (1101) and the second control switch (1102) are photo-transistors and the switch control signal is an optical signal.

3. The bidirectional switch of claim 1 wherein the first (802) and second (803) electronic switch devices are MOSFETs.

4. The bidirectional switch of claim 1 further comprising an AC to DC converter (1301) that supplies DC power to the switch control circuit (1103).

5. The bidirectional switch of claim 4 wherein the AC to DC converter (1301) comprises:

a. a voltage divider (1503) connected to an AC power source (1501), and, b. a first semiconductor switch (1504), having an input and an output, connected through its input to the voltage divider, and c. a second semiconductor switch (1505), having an input and an output, whose input is connected to the output of the first switch, and d. a storage capacitor (C1, 1606) connected through a diode (D2, 1606) to the output of the second semiconductor switch, and e. a sense resistor (R8, 1603) connected between the storage capacitor and the voltage divider thereby providing feedback control, and f. a Zener diode (D1, 1605) connected between the input and output of the second semiconductor switch thereby clamping the voltage of the output and input of the second semiconductor switch to the Zener voltage of the Zener diode, and g. the switch control circuit connected to the storage capacitor.

6. The bidirectional switch of claim 5 further comprising electronic circuitry (1607), interposed between the second semiconductor electronic switch and the storage capacitor (C1, 1606) to limit the current flowing through the first semiconductor switch.

7. The bidirectional switch of claim 5 wherein the first semiconductor switch (1504) and the second semiconductor switch (1505) are both MOS field effect transistors.

8. The bidirectional switch of claim 1, wherein the control signal (1104, 1105) is pulsed in synchronism with the AC power source to provide phase control of the AC power to the load.

9. The bidirectional switch circuit of claim 1, wherein the control signal (1104, 1105) is a train of pulses synchronized with the AC mains waveform and having adjustable pulse widths to effectively control the average current/power delivered to the load, thereby providing a dimming effect for a light source load and a speed control for an AC motor load.

10. An electrical circuit to supply power from an AC source, having a line and a return, to a load, the electrical circuit comprising:

a. a first bidirectional switch (1403) connected in the line comprising:

i. first and second series connected electronic switch devices, each switch device having a drain terminal, a source terminal and a gate terminal and being characterized by a threshold voltage specified between the gate terminal and the source terminal, wherein the drain terminal of the first switch device comprises the input terminal of the solid state bidirectional switch and drain terminal of the second switch devices comprise the output terminal of the solid state bidirectional switch, the source terminals of the first and second switch devices are interconnected at a first control terminal and the gate terminals of the first and second switch devices are interconnected at a second control terminal, and ii. a first control switch connected between the first control terminal and the second control terminal, and iii. a bias terminal connected to the second control terminal through a second control switch, and iv. a voltage regulator device connected between the bias terminal and the first control terminal, and v. a capacitor connected in parallel with the voltage regulator device, and vi. a first rectifier device connected from the input terminal of the switch circuit to the bias terminal through a first current limiting resistor, and vii. a second rectifier device connected from the output terminal of the switch circuit to the bias terminal through a second current limiting resistor, and viii. a switch control circuit having a control signal that controls the first control switch and the second control switch, such that first control switch is closed when the second control switch is open and vice versa, and b. an AC to DC converter (1301) that supplies DC power to the switch control circuit, wherein the AC to DC converter comprises:

i. a voltage divider connected to the AC power source, and, ii. a first semiconductor switch, having an input and an output, connected through its input to the voltage divider, and iii. a second semiconductor switch, having an input and an output, whose input is connected to the output of the first switch, and iv. a storage capacitor connected through a diode to the output of the second switch, and v. a sense resistor connected between the storage capacitor and the voltage divider thereby providing feedback control, and vi. a Zener diode connected between the input and output of the second semiconductor switch thereby clamping the voltage of the output and input of the second semiconductor switch to the Zener voltage of the Zener diode, and vii. the DC load connected to the storage capacitor, and viii. electronic circuitry interposed between the first semiconductor electronic switch and the storage capacitor to limit the current flowing through the first semiconductor switch.

11. The electrical circuit of claim 10 further comprising a second bidirectional switch (1404) located in the return line of the AC source, wherein the second bidirectional switch is comprised identically to the first bidirectional switch (1403), and the switch control circuit (1103) controls the first bidirectional switch and the second bidirectional switch.

12. The electrical circuit of claim 11 wherein the first bidirectional switch and the second bidirectional switch are opened and closed in synchronous.

13. The electrical circuit of claim 11 further comprising a third bidirectional switch (1405) that bypasses the load, the second bidirectional switch and the third bidirectional switch comprised identically to the first bidirectional switch (1403) and the switch control circuit (1103) controls the first bidirectional switch, the second bidirectional switch and the third bidirectional switch.

14. The electrical circuit of claim 13 wherein the third bidirectional switch is open when the first bidirectional switch is closed, and the third bidirectional switch is closed when the first bidirectional switch is open.

15. The electrical circuit of claim 10, wherein the switch control circuit is pulsed in synchronism with the AC power source to provide phase control of the AC power to the load.

16. The electrical circuit of claim 10, wherein the switch control signal is a train of pulses synchronized with the AC mains waveform and having adjustable pulse widths to effectively control the average current/power delivered to the load, thereby providing a dimming effect for a light source load and a speed control for an AC motor load.

* * * * *